(12) United States Patent
Shinohara

(10) Patent No.: US 8,207,441 B2
(45) Date of Patent: Jun. 26, 2012

(54) PHOTOVOLTAIC APPARATUS AND METHOD OF MANUFACTURING THE SAME

(75) Inventor: Wataru Shinohara, Kobe (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 546 days.

(21) Appl. No.: 11/705,770

(22) Filed: Feb. 14, 2007

(65) Prior Publication Data

US 2007/0193619 A1 Aug. 23, 2007

(30) Foreign Application Priority Data

Feb. 23, 2006 (JP) ................................. 2006-046083

(51) Int. Cl.
*H02N 6/00* (2006.01)
(52) U.S. Cl. .......................... 136/252; 136/244; 136/256
(58) Field of Classification Search .................. 136/252, 136/255
See application file for complete search history.

(56) References Cited

U.S. PATENT DOCUMENTS

| | | | | |
|---|---|---|---|---|
| 4,110,122 A | * | 8/1978 | Kaplow et al. | 136/249 |
| 4,675,467 A | * | 6/1987 | Van Dine et al. | 136/249 |
| 4,697,041 A | | 9/1987 | Okaniwa et al. | |
| 6,437,231 B2 | | 8/2002 | Kurata et al. | |
| 6,632,993 B2 | * | 10/2003 | Hayashi et al. | 136/256 |
| 7,235,736 B1 | | 6/2007 | Buller et al. | |
| 2003/0172967 A1 | | 9/2003 | Tachibana et al. | |

FOREIGN PATENT DOCUMENTS

| | | |
|---|---|---|
| EP | 1258925 | 11/2002 |
| EP | 1612862 | 1/2006 |
| JP | 61214483 | 9/1986 |
| JP | 63157482 A | 6/1988 |
| JP | 7335924 A | 12/1995 |
| JP | 9082998 A | 3/1997 |
| JP | 9129906 A | 5/1997 |
| JP | 2000058886 A | 2/2000 |
| JP | 2001274447 A | 10/2001 |
| JP | 2002-118273 | 4/2002 |
| JP | 2002-261308 | 9/2002 |
| JP | 2003273383 A | 9/2003 |
| JP | 2004-095661 A | 3/2004 |
| JP | 2005038907 A | 2/2005 |
| JP | 2005-093939 | 4/2005 |

(Continued)

OTHER PUBLICATIONS

Japanese Office Action, Jun. 30, 2009; English translation included.

(Continued)

*Primary Examiner* — Jennifer Michener
*Assistant Examiner* — Matthew Martin
(74) *Attorney, Agent, or Firm* — NDQ&M Watchstone LLP

(57) ABSTRACT

This photovoltaic apparatus comprises a second groove for electrically isolating first and second back electrodes from each other, a third groove formed on a region located between a first groove and the second groove to cut at least an intermediate layer from the upper surface of the second back electrode, a first insulating member embedded in the third groove to cover at least a cut portion of the intermediate layer and a conductive member electrically connected to the first substrate electrode on a region located between the second and third grooves and electrically connected to the second back electrode across the third groove.

11 Claims, 6 Drawing Sheets

FOREIGN PATENT DOCUMENTS

| | | |
|---|---|---|
| JP | 2005093939 A | 4/2005 |
| JP | 2005101384 A | 4/2005 |
| JP | 200538907 | 10/2005 |
| JP | 2006-313872 A | 11/2006 |

OTHER PUBLICATIONS

Chinese Office Action, May 22, 2009, English translation included.
Office Action issued on Jan. 24, 2011 in the corresponding to U.S. Appl. No. 12/169,374.
Extended European Search Report, dated Jan. 26, 2010.
Office Action issued on Jan. 24, 2011 in the corresponding to U.S. Appl. No, 12/169,374.
Office Action issued on Sep. 21, 2010 in the corresponding to Japanese Patent Application No. 2006-046083.
Office Action issued on Jul. 19, 2011 in the corresponding to Japanese Patent Application No. 2006-046083.
The Extended European Search Report issued on Aug. 12, 2011 in the corresponding to European Patent Application 08252322.6.

\* cited by examiner

PHOTOVOLTAIC APPARATUS AND METHOD OF MANUFACTURING THE SAME

BACKGROUND OF THE INVENTION

1. Field of the Invention

The present invention relates to a photovoltaic apparatus and a method of manufacturing the same, and more particularly, it relates to a photovoltaic apparatus comprising a conductive intermediate layer between a plurality of photoelectric conversion portions and a method of manufacturing the same.

2. Description of the Background Art

A photovoltaic apparatus comprising a conductive intermediate layer between a plurality of photoelectric conversion units (photoelectric conversion portions) is known in general, as disclosed in Japanese Patent Laying-Open No. 2002-118273, for example.

In the photovoltaic apparatus disclosed in the aforementioned Japanese Patent Laying-Open No. 2002-118273, first and second transparent electrodes are formed on a substrate at a prescribed interval, while a first photoelectric conversion unit is formed on the first and second transparent electrodes. A second photoelectric conversion unit is formed on the first photoelectric conversion unit through a conductive intermediate layer. First and second back electrodes are arranged on the second photoelectric conversion unit to correspond to the aforementioned first and second transparent electrodes respectively. The first back electrode is electrically connected to the second transparent electrode through a groove so formed as to pass through the second photoelectric conversion unit, the intermediate layer and the first photoelectric conversion unit.

In the photovoltaic apparatus disclosed in the aforementioned Japanese Patent Laying-Open No. 2002-118273, however, the first back electrode is in contact with the conductive intermediate in the groove, to disadvantageously result in an electrical short circuit between the first back electrode and the intermediate layer.

SUMMARY OF THE INVENTION

The present invention has been proposed in order to solve the aforementioned problem, and an object thereof is to provide a photovoltaic apparatus, comprising a conductive intermediate layer between a plurality of photoelectric conversion portions, capable of suppressing an electrical short circuit between a back electrode and the intermediate layer and a method of manufacturing the same.

In order to attain the aforementioned object, a photovoltaic apparatus according to a first aspect of the present invention comprises a substrate having an insulating surface, a first substrate electrode and a second substrate electrode formed on the insulating surface of the substrate and isolated from each other by a first groove, a first photoelectric conversion portion so formed as to cover the first substrate electrode and the second substrate electrode, a second photoelectric conversion portion formed on the surface of the first photoelectric conversion portion through a conductive intermediate layer, a first back electrode and a second back electrode, formed on the surface of the second photoelectric conversion portion, corresponding to the first substrate electrode and the second substrate electrode respectively, a second groove for electrically isolating the first back electrode and the second back electrode from each other, a third groove formed on a region located between the first groove and the second groove to cut at least the intermediate layer from the upper surface of the second back electrode, a first insulating member embedded in the third groove to cover at least a cut portion of the intermediate layer and a conductive member electrically connected to the first substrate electrode on a region located between the second groove and the third groove and electrically connected to the second back electrode across the third groove.

As hereinabove described, the photovoltaic apparatus according to the first aspect is provided with the third groove so formed as to cut at least the intermediate layer from the upper surface of the second back electrode on the region located between the first groove for electrically isolating the first and second substrate electrodes from each other and the second groove for electrically isolating the first and second back electrodes from each other respectively and the first insulating member embedded in the third groove to cover at least the cut portion of the intermediate layer, whereby the first insulating member can electrically insulate portions of the intermediate layer closer to the first and second grooves with respect to the third groove respectively from each other. Further, the photovoltaic apparatus is provided with the conductive member electrically connected to the first substrate electrode on the region located between the second groove for electrically isolating the first and second back electrodes from each other and the third groove filled up with the first insulating member and electrically connected to the second back electrode across the third groove, whereby the conductive member, electrically insulated from the portion of the intermediate layer closer to the first groove with respect to the third groove by the aforementioned first insulating member, can be inhibited from an electrical short circuit with the portion of the intermediate layer closer to the first groove with respect to the third groove. In addition, the conductive member is provided independently of the back electrodes so that a manufacturing process of subsequently forming the back electrodes after forming the second photoelectric conversion portion and thereafter forming the conductive member can be employed, whereby the surface of the second photoelectric conversion portion, to be most inhibited from contamination in the process of manufacturing the photovoltaic apparatus, can be prevented from exposure to the atmosphere.

The aforementioned photovoltaic apparatus according to the first aspect preferably further comprises a fourth groove formed on the region located between the second groove and the third groove to pass through the second back electrode, the second photoelectric conversion portion, the intermediate layer and the first photoelectric conversion portion and expose the surface of the first substrate electrode, and the conductive member is preferably embedded in the fourth groove to come into contact with the surface of the first substrate electrode exposed in the fourth groove and formed to be electrically connected to the second back electrode across the first insulating member embedded in the third groove. According to this structure, the conductive member embedded in the fourth groove, electrically insulated from the portion of the intermediate layer closer to the first groove with respect to the third groove by the first insulating member embedded in the third groove, can be inhibited from an electrical short circuit with the portion of the intermediate layer closer to the first groove with respect to the third groove.

In the aforementioned photovoltaic apparatus according to the first aspect, the conductive member preferably includes a conductive melt portion obtained by partially melting the second back electrode, the second photoelectric conversion portion, the intermediate layer and the first photoelectric conversion portion and electrically connected to the first substrate electrode and a connecting portion formed to be electrically connected to the melt portion and to be electrically connected to the second back electrode across the first insulating member embedded in the third groove on the region located between the second groove and the third groove. According to this structure, the quantity of the material constituting the connecting portion can be reduced due to the melt portion as compared with a case of connecting the first substrate electrode and the second back electrode with each other only through the material constituting the connecting portion.

In the aforementioned photovoltaic apparatus according to the first aspect, the first insulating member preferably fills up the third groove. According to this structure, the conductive member can be reliably electrically insulated from the portion of the intermediate layer closer to the first groove with respect to the third groove.

In this case, the upper surface of the first insulating member may be so formed as to project upward beyond the upper surface of the second back electrode.

In the aforementioned photovoltaic apparatus according to the first aspect, the conductive member may be so formed as to come into contact with the surface of a region of the second back electrode located between the first groove and the third groove.

In the aforementioned photovoltaic apparatus according to the first aspect, the second groove may be so formed as to pass through the second back electrode, the second photoelectric conversion portion, the intermediate layer and the first photoelectric conversion portion and expose the surface of the first substrate electrode.

In the aforementioned photovoltaic apparatus according to the first aspect, the third groove is preferably so formed as to pass through the second back electrode, the second photoelectric conversion portion, the intermediate layer and the first photoelectric conversion portion and expose the surface of the first substrate electrode. According to this structure, the second back electrode, the second photoelectric conversion portion, the intermediate layer and the first photoelectric conversion portion can be parted through the third groove, whereby portions of the second back electrode, the second photoelectric conversion portion, the intermediate layer and the first photoelectric conversion portion closer to the first groove with respect to the third groove and those of the second back electrode, the second photoelectric conversion portion, the intermediate layer and the first photoelectric conversion portion closer to the conductive member with respect to the third groove can be inhibited from electrical connection. Thus, adjacent photovoltaic elements can be easily electrically insulated from each other through the third groove.

The aforementioned photovoltaic apparatus according to the first aspect preferably further comprises a second insulating member embedded in the second groove. According to this structure, the conductive member so formed as to connect the first substrate electrode and the second back electrode with each other can be inhibited from entering the second groove. Thus, the photovoltaic apparatus can be inhibited from an electrical short circuit resulting from the conductive member entering the second groove.

In this case, the second insulating member preferably fills up the second groove. According to this structure, the conductive member can be reliably prevented from entering the second groove.

In the aforementioned photovoltaic apparatus according to the first aspect, the intermediate layer may have a function of partly reflecting and partly transmitting light incident from the side of the substrate.

A method of manufacturing a photovoltaic apparatus according to a second aspect of the present invention comprises steps of forming a substrate electrode on an insulating surface of a substrate having the insulating surface, forming a first substrate electrode and a second substrate electrode isolated from each other by a first groove by forming the first groove on the substrate electrode, forming a first photoelectric conversion portion to cover the first substrate electrode and the second substrate electrode, forming a second photoelectric conversion portion on the surface of the first photoelectric conversion portion through a conductive intermediate layer, forming a back electrode on the surface of the second photoelectric conversion portion, thereafter forming a second groove for separating the back electrode into a first back electrode and a second back electrode while forming a third groove on a region located between the first groove and the second groove to pass through at least the intermediate layer from the upper surface of the second back electrode, forming a first insulating member in the third groove to cover at least a cut portion of the intermediate layer and forming a conductive member electrically connected to the first substrate electrode on a region located between the second groove and the third groove and electrically connected to the second back electrode across the third groove.

The aforementioned method of manufacturing a photovoltaic apparatus according to the second aspect preferably further comprises a step of forming a fourth groove on the region located between the second groove and the third groove to pass through the second back electrode, the second photovoltaic conversion portion, the intermediate layer and the first photoelectric conversion portion and expose the surface of the first substrate electrode, and the step of forming the conductive member preferably includes a step of embedding the conductive member in the fourth groove to come into contact with the surface of the first substrate electrode exposed in the fourth groove while electrically connecting the conductive member to the second back electrode across the first insulating member embedded in the third groove. According to this structure, the conductive member embedded in the fourth groove, electrically insulated from a portion of the intermediate layer closer to the first groove with respect to the third groove through the first insulating member embedded in the third groove, can be so provided as to cause no electrical short circuit with the portion of the intermediate layer closer to the first groove with respect to the third groove.

In the aforementioned method of manufacturing a photovoltaic apparatus according to the second aspect, the step of forming the second groove and the third groove is preferably carried out substantially simultaneously with the step of forming the fourth groove. According to this structure, the steps of manufacturing the photovoltaic apparatus can be simplified.

In the aforementioned method of manufacturing a photovoltaic apparatus according to the second aspect, the step of forming the conductive member may include a step of forming the conductive member to come into contact with a region of the second back electrode located between the first groove and the third groove.

In the aforementioned method of manufacturing a photovoltaic apparatus according to the second aspect, the step of forming the conductive member preferably includes steps of forming a conductive melt portion electrically connected to the first substrate electrode by partially melting the second back electrode, the second photoelectric conversion portion, the intermediate layer and the first photoelectric conversion portion on the region located between the second groove and the third groove and forming a connecting portion to be electrically connected to the melt portion and to be electrically connected to the second back electrode across the first insulating member embedded in the third groove. According to this structure, the first substrate electrode and the second back electrode can be electrically connected to each other by forming the connecting portion with a smaller quantity of material due to the melt portion as compared with a case of connecting the first substrate electrode and the second back electrode with each other only through the material constituting the connecting portion.

In the aforementioned method of manufacturing a photovoltaic apparatus according to the second aspect, the step of forming the third groove preferably includes a step of forming the third groove to pass through the second back electrode, the second photoelectric conversion portion, the intermediate layer and the first photoelectric conversion portion and expose the surface of the first substrate electrode. According to this structure, the second back electrode, the second photoelectric conversion portion, the intermediate layer and the first photoelectric conversion portion can be parted through the third groove, whereby portions of the second back electrode, the second photoelectric conversion portion, the intermediate layer and the first photoelectric conversion portion closer to the first groove with respect to the third groove and those of the second back electrode, the second photoelectric conversion portion, the intermediate layer and the first photoelectric conversion portion closer to the conductive member with respect to the third groove can be inhibited from electrical connection. Thus, the conductive member and the portion of the intermediate layer closer to the first groove with respect to the third groove can be inhibited from electrical connection.

In this case, the step of forming the first insulating member preferably includes a step of filling the third groove with the first insulating member. According to this structure, the conductive member and the portion of the intermediate layer closer to the first groove with respect to the third groove can be reliably electrically insulated from each other.

In the aforementioned method of manufacturing a photovoltaic apparatus according to the second aspect, the step of forming the second groove may include a step of forming the second groove to pass through the second back electrode, the second photoelectric conversion portion, the intermediate layer and the first photoelectric conversion portion and expose the surface of the first substrate electrode.

In this case, the method of manufacturing a photovoltaic apparatus preferably further comprises a step of filling the second groove with a second insulating member. According to this structure, the conductive member so formed as to connect the first substrate electrode and the second back electrode with each other can be inhibited from entering the second groove. Thus, the photovoltaic apparatus can be inhibited from an electrical short circuit resulting from the conductive member entering the second groove.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a photovoltaic apparatus 1 according to a first embodiment of the present invention is described with reference to FIG. 1.

Figure 1:
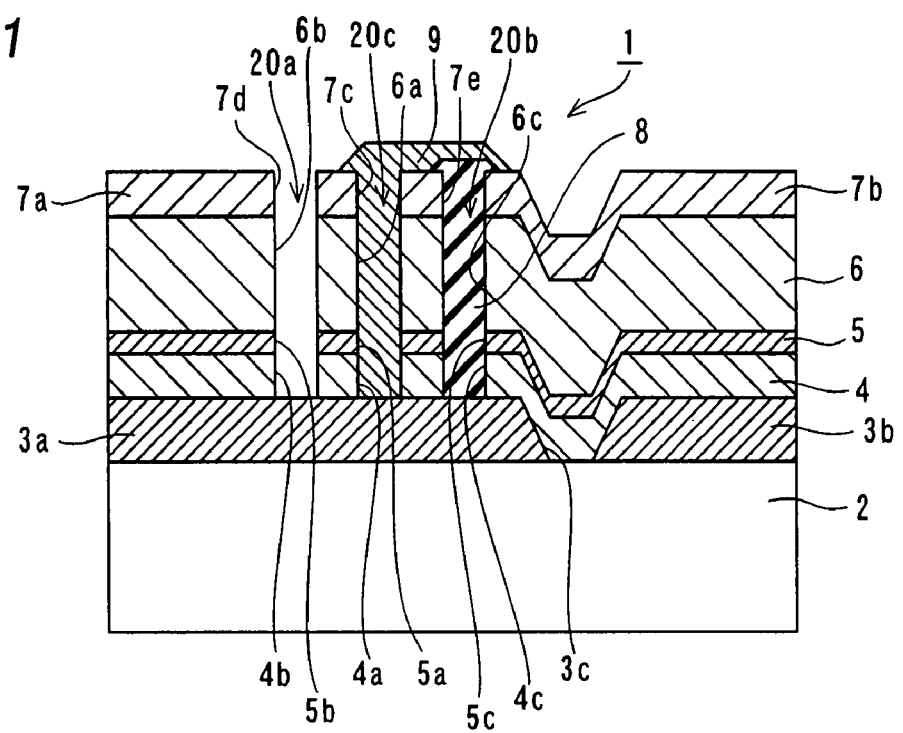
FIG. 1 is a sectional view showing the structure of a photovoltaic apparatus according to a first embodiment of the present invention.

As shown in FIG. 1, the photovoltaic apparatus 1 according to the first embodiment comprises a substrate 2, substrate electrodes 3a and 3b, a photoelectric conversion unit 4, an intermediate layer 5, another photoelectric conversion unit 6, back electrodes 7a and 7b, an insulating member 8 and a connecting electrode 9. This photovoltaic apparatus 1 according to the first embodiment is formed by serially connecting a plurality of units with each other in a direction along the main surface of the substrate 2 through the connecting electrode 9. The structure of the photovoltaic apparatus 1 is now described in detail.

The substrate 2, having an insulating surface, consists of translucent glass. This substrate 2 has a thickness of about 1 mm to about 5 mm. The substrate electrodes 3a and 3b isolated from each other by a groove 3c are formed on the upper surface of the substrate 2. The substrate electrodes 3a and 3b, each having a thickness of about 800 nm, consist of TCO (transparent conductive oxide) such as tin oxide ($SnO_2$) having conductivity and translucency. The substrate electrodes 3a and 3b are examples of the "first substrate electrode" and the "second substrate electrode" in the present invention respectively, and the groove 3c is an example of the "first groove" in the present invention.

The photoelectric conversion unit 4 consisting of a p-i-n amorphous silicon semiconductor is formed on the upper surfaces of the substrate electrodes 3a and 3b. This photoelectric conversion unit 4 of the p-i-n amorphous silicon semiconductor is constituted of a p-type hydrogenated amorphous silicon carbide (a-SiC:H) layer having a thickness of about 10 nm to about 20 nm, an i-type hydrogenated amorphous silicon (a-Si:H) layer having a thickness of about 250 nm to about 350 nm and an n-type hydrogenated amorphous silicon layer having a thickness of about 20 nm to about 30 nm. The photoelectric conversion unit 4 is formed on the upper surface of the substrate electrode 3a to have grooves 4a, 4b and 4c and fill up the groove 3c. The photoelectric conversion unit 4 of the amorphous silicon semiconductor is formed for absorbing light of a relatively short wavelength. This photoelectric conversion unit 4 is an example of the "first photoelectric conversion portion" in the present invention.

The intermediate layer 5 having grooves 5a, 5b and 5c on regions corresponding to the regions 4a, 4b and 4c respectively is formed on the upper surface of the photoelectric conversion unit 4. This intermediate layer 5 has a thickness of about 10 nm to about 500 nm. The intermediate layer 5 consists of TCO such as zinc oxide (ZnO) having conductivity with a function of partly reflecting and partly transmitting light incident from the side of the substrate 2. The intermediate layer 5 also has a function of increasing the quantity of light passing through the photoelectric conversion unit 4 by partly reflecting the light incident from the side of the substrate 2. Therefore, an output current of the photoelectric conversion unit 4 can be increased without increasing the thickness thereof. In other words, the output current of the photoelectric conversion unit 4 can be increased while suppressing photo-deterioration remarkably increased in response to the thickness of the photoelectric conversion unit 4 of the amorphous silicon semiconductor. Thus, the output currents of the photoelectric conversion units 4 and 6 can be balanced.

The photoelectric conversion unit 6 of a p-i-n microcrystalline silicon semiconductor having grooves 6a, 6b and 6c on regions corresponding to the grooves 5a, 5b and 5c respectively is formed on the upper surface of the intermediate layer 5. This photoelectric conversion unit 6 of the p-i-n microcrystalline silicon semiconductor is constituted of a p-type hydrogenated microcrystalline silicon (μc-Si:H) layer having a thickness of about 10 nm to about 20 nm, an i-type hydrogenated microcrystalline silicon layer having a thickness of about 1500 nm to about 2000 nm and an n-type hydrogenated microcrystalline silicon layer having a thickness of about 20 nm to about 30 nm. The photoelectric conversion unit 6 of the p-i-n microcrystalline silicon semiconductor is formed for absorbing light of a relatively long wavelength. The photoelectric conversion unit 6 is an example of the "second photoelectric conversion portion" in the present invention.

The back electrodes 7a and 7b isolated from each other by a groove 7d formed on a region corresponding to the groove 6b are formed on the upper surface of the photoelectric conversion unit 6. The back electrode 7b has grooves 7c and 7e on regions corresponding to the grooves 6a and 6c respectively. The back electrodes 7a and 7b, each having a thickness of about 200 nm to about 400 nm, consist of a metal material mainly composed of silver (Ag). These back electrodes 7a and 7b have a function of reflecting light incident from the lower surface of the substrate 2 to reach the back electrodes 7a and 7b thereby reintroducing the same into the photoelectric conversion units 4 and 6. The back electrodes 7a and 7b are examples of the "first back electrode" and the "second back electrode" in the present invention respectively.

According to the first embodiment, the grooves 4b, 5b, 6b and 7d constitute a groove 20a for electrically isolating the back electrodes 7a and 7b from each other, while the grooves 4c, 5c, 6c and 7e constitute a groove 20b for electrically isolating portions of the intermediate layer 5 from each other. Further, the grooves 4a, 5a, 6a and 7c constitute a groove 20c for electrically connecting the back electrode 7b and the substrate electrode 3a with each other. Thus, the grooves 20a, 20b and 20c are so formed as to pass through a back electrode 7 (back electrodes 7a and 7b), the photoelectric conversion unit 6, the intermediate layer 5 and the photoelectric conversion unit 4 and expose the surface of the substrate electrode 3a. The grooves 20a, 20b and 20c are examples of the "second groove", the "third groove" and the "fourth groove" in the present invention respectively.

According to the first embodiment, the insulating member 8 consists of epoxy resin containing aluminum oxide ($Al_2O_3$) particles, and is so embedded as to fill up the groove 20b. In other words, the insulating member 8 is so embedded as to electrically insulate portions of the groove 5c of the intermediate layer 5 located closer to the grooves 3c and 5a respectively from each other. The upper surface of the insulating member 8 is so provided as to protrude upward beyond the upper surface of the back electrode 7b. The insulating member 8 is an example of the "first insulating member" in the present invention.

According to the first embodiment, the connecting electrode 9 consists of conductive paste (silver paste). This connecting electrode 9 is embedded in the groove 20c to come into contact with the surface of the substrate electrode 3a exposed in the groove 20c, and formed to be electrically connected to the upper surface of a region of the back electrode 7b of the adjacent unit located between the grooves 3c and 20b across the insulating member 8. Thus, the substrate electrode 3a and the back electrode 7b of the adjacent unit are serially connected with each other. The connecting electrode 9 is an example of the "conductive member" in the present invention.

A process of manufacturing the photovoltaic apparatus 1 according to the first embodiment of the present invention is now described with reference to FIGS. 1 to 6.

Figure 2:
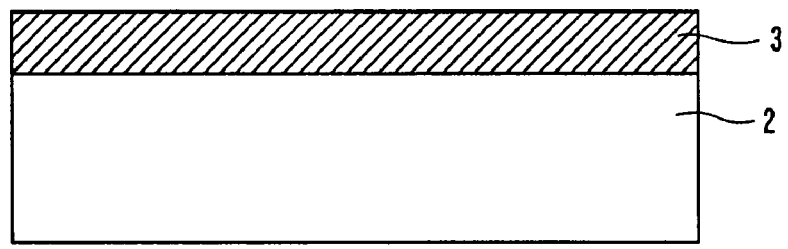
FIGS. 2 to 6 are sectional views for illustrating a process of manufacturing the photovoltaic apparatus according to the first embodiment shown in FIG. 1.

As shown in FIG. 2, a substrate electrode 3 of tin oxide having a thickness of about 800 nm is formed on the insulating upper surface of the substrate 2 by thermal CVD (chemical vapor deposition).

Figure 3:
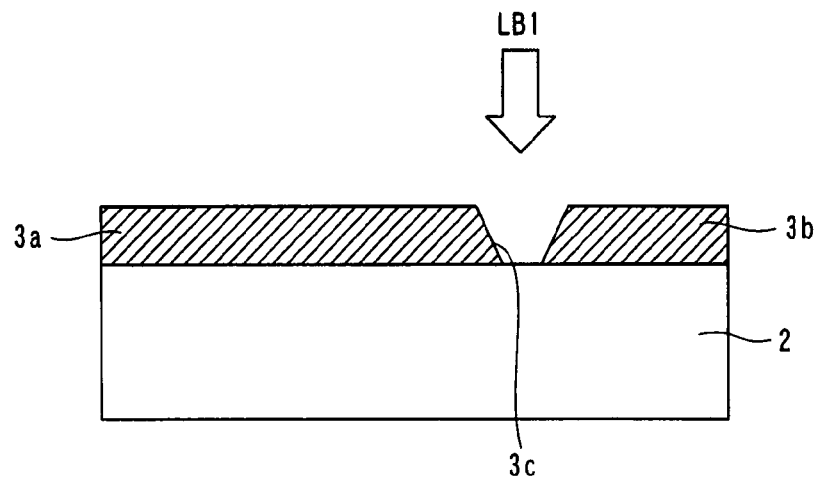

As shown in FIG. 3, the groove 3c is formed by scanning the substrate electrode 3 with a fundamental wave LB1 of an Nd:YAG laser having a wavelength of about 1064 nm, an oscillation frequency of about 20 kHz and average power of about 14.0 W from above. Thus, the substrate electrode 3 is separated into the substrate electrodes 3a and 3b through the groove 3c.

Figure 4:
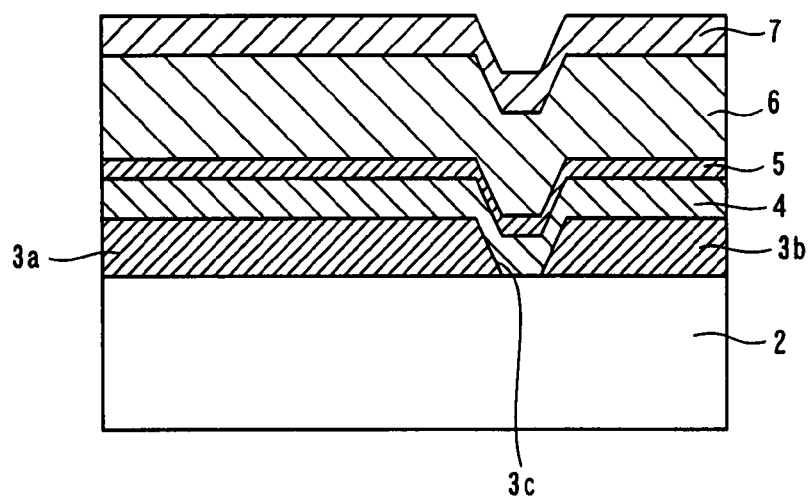

As shown in FIG. 4, the photoelectric conversion unit 4 of the amorphous silicon semiconductor is formed by successively forming the p-type hydrogenated amorphous silicon carbide layer having the thickness of about 10 nm to about 20 nm, the i-type hydrogenated amorphous silicon layer having the thickness of about 250 nm to about 350 nm and the n-type hydrogenated amorphous silicon layer having the thickness of about 20 nm to about 30 nm on the upper surfaces of the substrate electrodes 3a and 3b by plasma CVD. Thereafter the intermediate layer 5 of zinc oxide having the thickness of about 10 nm to about 500 nm is formed on the upper surface of the photoelectric conversion unit 4 by sputtering. Then, the photoelectric conversion unit 6 of the microcrystalline silicon semiconductor is formed by successively forming the p-type hydrogenated microcrystalline silicon layer having the thickness of about 10 nm to about 20 nm, the i-type hydrogenated microcrystalline silicon layer having the thickness of about 1500 nm to about 2000 nm and the n-type hydrogenated microcrystalline silicon layer having the thickness of about 20 nm to about 30 nm on the upper surface of the intermediate layer 5 by plasma CVD.

Thereafter the back electrode 7, having the thickness of about 200 nm to about 400 nm, of the metal material mainly composed of silver is formed on the upper surface of the photoelectric conversion unit 6 by sputtering.

According to the first embodiment, the photoelectric conversion unit 4, the intermediate layer 5, the photoelectric conversion unit 6 and the back electrode 7 are so continuously formed that the surfaces of the photoelectric conversion unit 4, the intermediate layer 5 and the photoelectric conversion unit 6 are not exposed to the atmosphere.

Figure 5:
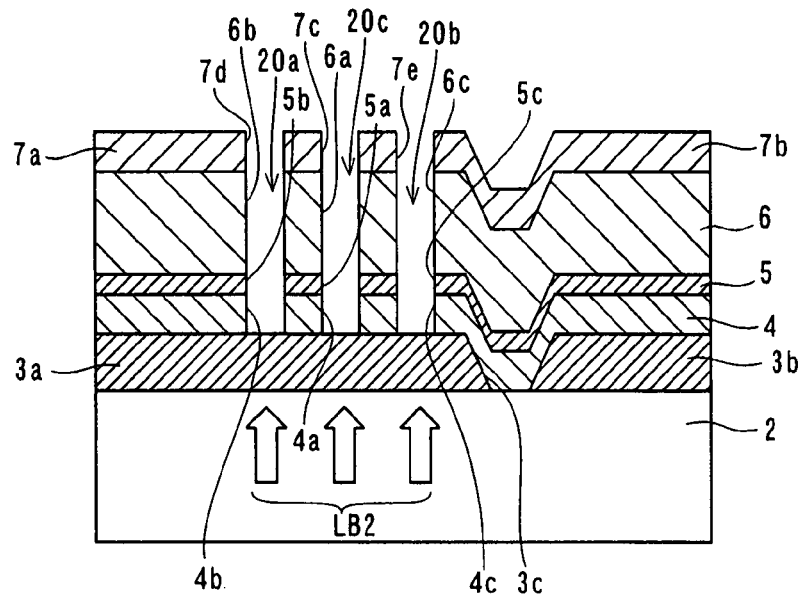

As shown in FIG. 5, the groove 20a constituted of the grooves 4b, 5b, 6b and 7d, the groove 20b constituted of the grooves 4c, 5c, 6c and 7e and the groove 20c constituted of the grooves 4a, 5a, 6a and 7c are simultaneously formed to be adjacent to the groove 3c by scanning the photoelectric conversion unit 4, the intermediate layer 5, the photoelectric conversion unit 6 and the back electrode 7 with second harmonics LB2 of an Nd:YAG laser having a wavelength of about 532 nm, an oscillation frequency of about 12 kHz and average power of about 230 mW from the side of the substrate 2. Thus, the back electrode 7 is separated into the back electrodes 7a and 7b through the groove 20a.

Figure 6:
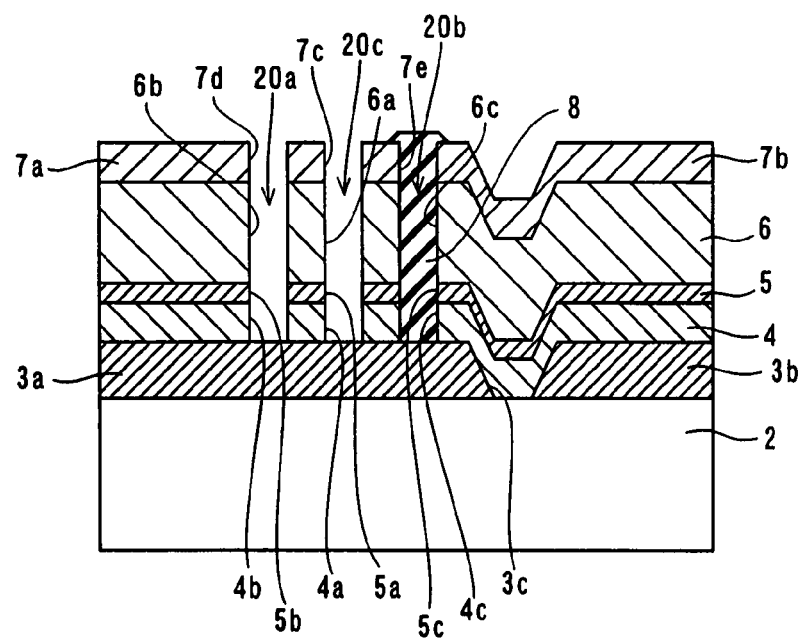

As shown in FIG. 6, the insulating member 8 of epoxy resin containing aluminum oxide particles is applied by screen printing, to fill up the groove 20b and extend onto the back electrode 7b. Thereafter the connecting electrode 9 is applied by screen printing, to fill up the groove 20c and be electrically connected to the back electrode 7b across the insulating member 8, as shown in FIG. 1.

According to the first embodiment, as hereinabove described, the photovoltaic apparatus 1 is provided with the groove 20b so formed as to cut the intermediate layer 5 on the region located between the groove 3c for electrically isolating the substrate electrodes 3a and 3b from each other and the groove 20a for electrically isolating the back electrodes 7a and 7b from each other as well as the insulating member 8 embedded in the groove 20b, so that the insulating member 8 can electrically insulate the portions of the intermediate layer 5 closer to the grooves 3c and 20c with respect to the groove 20b respectively from each other. The photovoltaic apparatus 1 is further provided with the groove 20c on the region located between the groove 20a for electrically isolating the back electrodes 7a and 7b from each other and the groove 20b filled up with the insulating member 8 and the connecting electrode 9 electrically connected to the surface of the substrate electrode 3a exposed in the groove 20c and electrically connected to the back electrode 7b of the adjacent unit across the insulating member 8, so that the connecting electrode 9, electrically insulated from the portion of the intermediate layer 5 closer to the groove 3c with respect to the groove 20b by the aforementioned insulating member 8, can be inhibited from an electrical short circuit with the portion of the intermediate layer 5 closer to the groove 3c with respect to the groove 20b.

According to the first embodiment, the connecting electrode 9 is provided independently of the back electrode 7 so that the manufacturing process of subsequently forming the back electrode 7 after forming the second photoelectric conversion unit 6 and thereafter forming the groove 20c while forming the connecting member 9 in this groove 20c can be employed, whereby the surface of the photoelectric conversion unit 6, to be most inhibited from contamination in the process of manufacturing the photovoltaic apparatus 1, can be prevented from exposure to the atmosphere.

Figure 7:
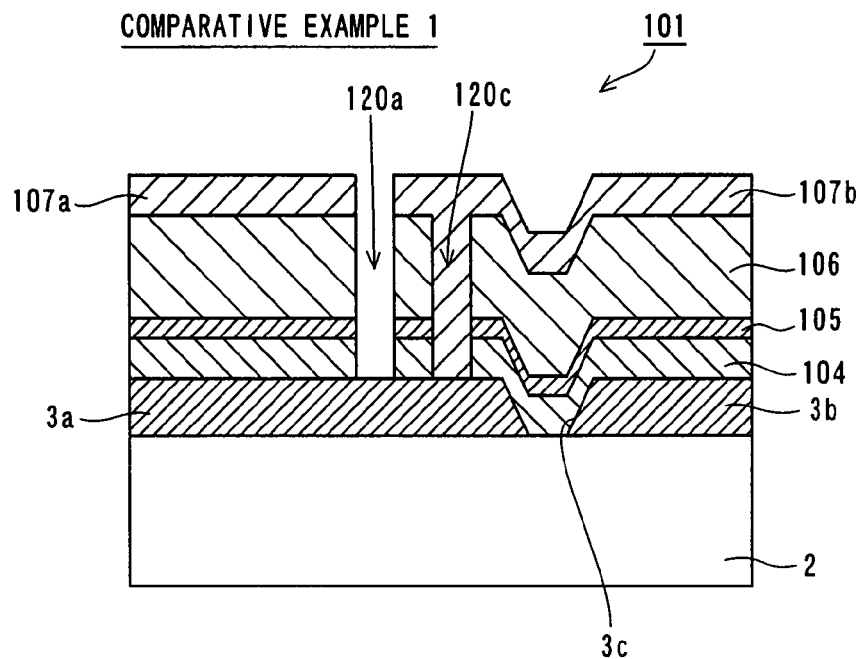
FIG. 7 is a sectional view showing the structure of a photovoltaic apparatus according to comparative example with respect to the first embodiment of the present invention.

An experiment conducted for confirming the aforementioned effects of the first embodiment is now described. In this confirmatory experiment, photovoltaic apparatuses 1 and 101 according to Example 1 and comparative example 1 were prepared as follows:

First, the photovoltaic apparatus 1 according to Example 1 was prepared as shown in FIG. 1, through the manufacturing process employed in the first embodiment. The photovoltaic apparatus 101 according to comparative example 1 was prepared to have a structure shown in FIG. 7. At this time, a photoelectric conversion unit 104, an intermediate layer 105, another photoelectric conversion unit 106 and back electrodes 107a and 107b of the photovoltaic apparatus 101 according to comparative example 1 were so formed as to have the same thicknesses and compositions as those of a photoelectric conversion unit 4, an intermediate layer 5, another photoelectric conversion unit 6 and back electrodes 7a and 7b of the photovoltaic apparatus 1 according to Example 1 respectively. Further, the photovoltaic apparatus 101 according to comparative example 1 was formed with only grooves 120a and 120c corresponding to grooves 20a and 20c among grooves 20a, 20b and 20c of the photovoltaic apparatus 1 according to Example 1 respectively. According to comparative example 1, the back electrode 107b was directly embedded in the groove 120c, to be electrically connected to a substrate electrode 3a.

As to the photovoltaic apparatuses 1 and 101 prepared according to the aforementioned Example 1 and comparative example 1, open circuit voltages (Voc), short circuit currents (Isc), fill factors (F.F.), maximum power levels (Pmax) and conversion efficiency levels (Eff.) were measured and the results of the measurements were standardized with those of the photovoltaic apparatus 101. Table 1 shows the results.

TABLE 1

|  | Open Circuit Voltage | Short Circuit Voltage | Fill Factor | Maximum Power | Conversion Efficiency |
|---|---|---|---|---|---|
| Example 1 | 1.00 | 1.04 | 1.01 | 1.05 | 1.05 |
| Comparative Example 1 | 1.00 | 1.00 | 1.00 | 1.00 | 1.00 |

Referring to Table 1, it has been proved that the open circuit voltage of the photovoltaic apparatus 1 according to Example 1 is identical to that of the photovoltaic apparatus 101 according to comparative example 1. It has also been proved that the short circuit current and the fill factor of the photovoltaic apparatus 1 according to Example 1 are improved by 4% and 1% with respect to those of the photovoltaic apparatus 101 according to comparative example 1 respectively. It has further been proved that the maximum power and the conversion efficiency of the photovoltaic apparatus 1 according to Example 1 are improved by 5% and 5% with respect to those of the photovoltaic apparatus 101 according to comparative example 1 respectively.

The aforementioned results have conceivably been obtained for the following reasons: In the photovoltaic apparatus 1 according to Example 1 shown in FIG. 1, an insulating member 8 electrically isolates a connecting electrode 9 from a portion of the intermediate layer 5 closer to a groove 3c with respect to the groove 20b for inhibiting the connecting electrode 9 from an electrical short circuit with the portion of the intermediate layer 5 closer to the groove 3c with respect to the groove 20b, thereby conceivably improving the conversion efficiency. In the photovoltaic apparatus 101 according to comparative example 1 shown in FIG. 7, on the other hand, the back electrode 107b embedded in the groove 120c is in contact with the intermediate layer 5 in this groove 120c to cause an electrical short circuit with the intermediate layer 105, conceivably resulting in reduction of the conversion efficiency.

Second Embodiment

Figure 8:
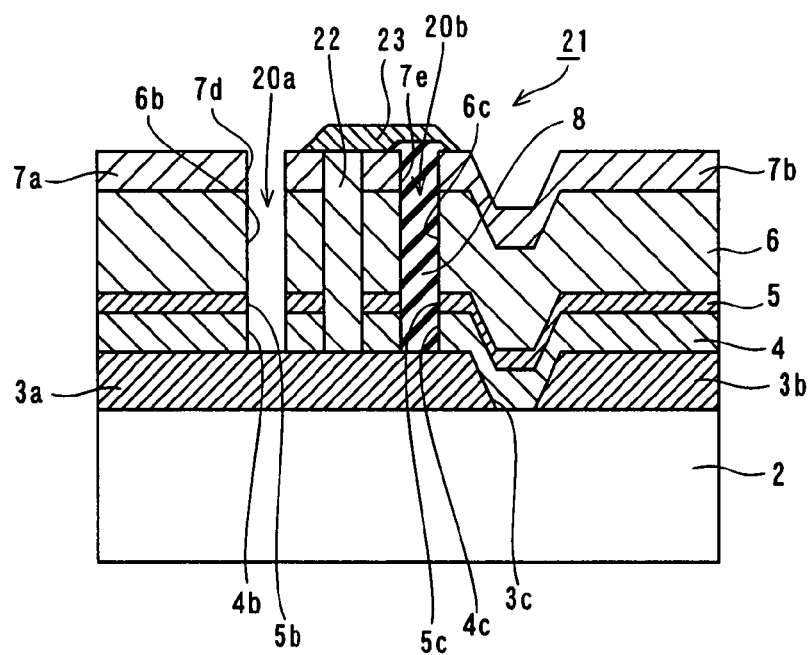
FIG. 8 is a sectional view showing the structure of a photovoltaic apparatus according to a second embodiment of the present invention.

Referring to FIG. 8, a silicon melt 22 and a connecting electrode 23 electrically connect a substrate electrode 3a and a back electrode 7b with each other in a photovoltaic apparatus 21 according to a second embodiment of the present invention, dissimilarly to the aforementioned first embodiment.

As shown in FIG. 8, the silicon melt 22 is formed in a region located between grooves 20a and 20b by partially melting a photoelectric conversion unit 4, an intermediate layer 5, another photoelectric conversion unit 6 and the back electrode 7b in the photovoltaic apparatus 21 according to the second embodiment. This silicon melt 22 has conductivity, and is electrically connected to the substrate electrode 3a. The silicon melt 22 is an example of the "melt portion" or the "conductive member" in the present invention.

According to the second embodiment, the connecting electrode 23 is electrically connected with the silicon melt 22, and electrically connected to another back electrode 7b across an insulating member 8 embedded in the groove 20b. The connecting electrode 23 is an example of the "connecting portion" or the "conductive member" in the present invention.

A process of manufacturing the photovoltaic apparatus 21 according to the second embodiment of the present invention is now described with reference to FIGS. 8 to 11. Steps up to formation of a back electrode 7 are similar to those for the photovoltaic apparatus 1 according to the first embodiment shown in FIGS. 2 to 4.

Figure 9:
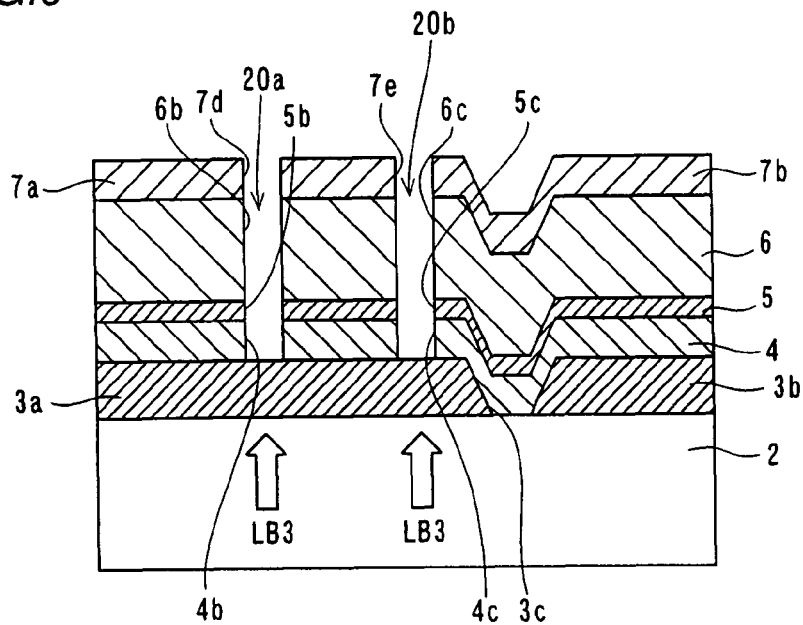
FIGS. 9 to 11 are sectional views for illustrating a process of manufacturing the photovoltaic apparatus according to the second embodiment shown in FIG. 7.

According to the second embodiment, the groove 20a constituted of grooves 4b, 5b, 6b and 7d and the groove 20b constituted of grooves 4c, 5c, 6c and 7e are simultaneously formed to be adjacent to the groove 3c by scanning the photoelectric conversion unit 4, the intermediate layer 5, the photoelectric conversion unit 6 and the back electrode 7 with second harmonics LB3 of an Nd:YAG laser having a wavelength of about 532 nm, an oscillation frequency of about 12 kHz and average power of about 230 mW from the side of a substrate 2, as shown in FIG. 9. Thus, the back electrode 7 is separated into the back electrodes 7a and 7b through the groove 20a.

Figure 10:
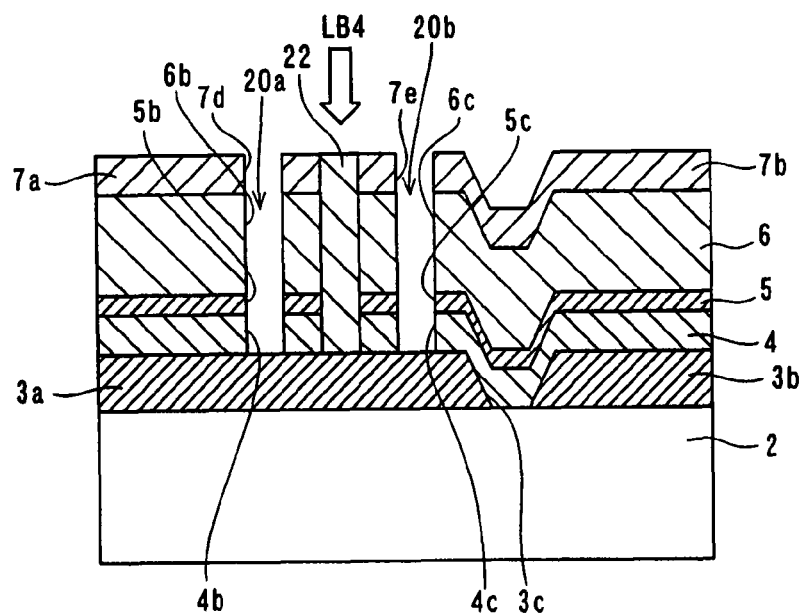
Figure 11:
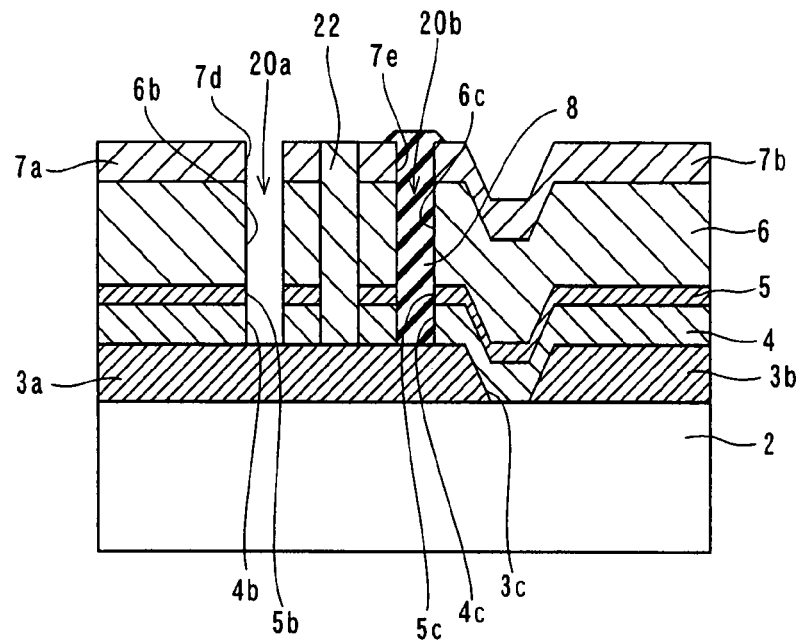

As shown in FIG. 10, the photoelectric conversion unit 4, the intermediate layer 5, the photoelectric conversion unit 6 and the back electrode 7b are scanned with a fundamental wave LB4 of an Nd:YAG laser having a wavelength of about 1064 nm, an oscillation frequency of about 20 kHz and average power of about 8 W on the region located between the grooves 20a and 20b from the side of the back electrode 7b to be partially melted, thereby forming the silicon melt 22. Thereafter the insulating member 8 of epoxy resin containing aluminum oxide particles is applied by screen printing to fill up the groove 20b and extend onto the back electrode 7b, as shown in FIG. 11.

Then, the connecting electrode 23 of silver paste is applied by screen printing, to come into contact with the surface of the silicon melt 22 and be electrically connected to the back electrode 7b across the insulating member 8.

According to the second embodiment, as hereinabove described, the silicon melt 22 and the connecting electrode 23 electrically connect the substrate electrode 3a and the back electrode 7b with each other, whereby the quantity of the material for the connecting electrode 23 of silver paste can be reduced as compared with the first embodiment connecting the substrate electrode 3a and the back electrode 7b with each other only through the connecting electrode 9.

The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

Figure 12:
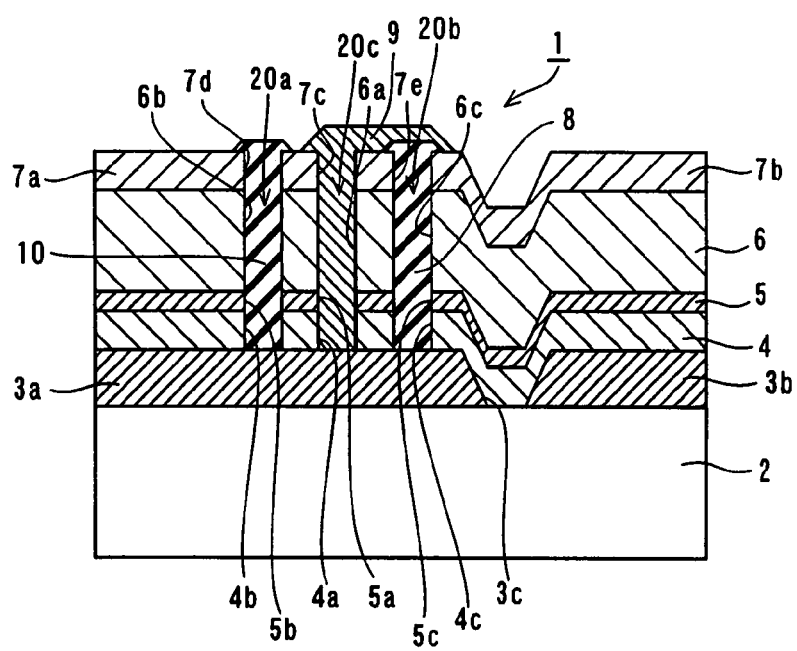
FIG. 12 is a sectional view showing the structure of a photovoltaic apparatus according to a modification of the first embodiment of the present invention.

For example, while the groove 7d separates the back electrodes 7a and 7b from each other in each of the aforementioned first and second embodiments, the present invention is not restricted to this but a groove 7d may separate back electrodes 7a and 7b from each other and an insulating member 10 may fill up a groove 20a constituted of grooves 4b, 5b, 6b and 7d, as in a photovoltaic apparatus according to a modification of the first embodiment shown in FIG. 12. According to this structure, the photovoltaic apparatus can be inhibited from an electrical short circuit resulting from silver paste entering the groove 20a when a connecting electrode 9 or 23 is screen-printed. The insulating member 10 is an example of the "second insulating member" in the present invention.

While the groove 20b constituted of the grooves 4c, 5c, 6c and 7e is formed and filled up with the insulating member 8 in each of the aforementioned first and second embodiments, the present invention is not restricted to this but at least the groove 5c may be formed to be filled up with the insulating member 8 for covering at least a cut portion of the groove 5c.

What is claimed is:

1. A photovoltaic apparatus comprising:
a substrate having an insulating surface;
a first substrate electrode and a second substrate electrode formed on said insulating surface of said substrate and isolated from each other by a first groove;
a first photoelectric conversion portion so formed as to cover said first substrate electrode and said second substrate electrode;
a second photoelectric conversion portion formed on the surface of said first photoelectric conversion portion through a conductive intermediate layer;
a first back electrode and a second back electrode, formed on the surface of said second photoelectric conversion portion, corresponding to said first substrate electrode and said second substrate electrode respectively wherein the lower surface of the back electrode directly contacts the second photovoltaic layer;
a second groove for electrically isolating said first back electrode and said second back electrode from each other;
a third groove formed on a region located between said first groove and said second groove to cut at least said intermediate layer from a side of said second back electrode;
a first insulating member embedded in said third groove to cover at least a cut portion of said intermediate layer; and
a conductive member electrically connected to said first substrate electrode on a region located between said second groove and said third groove and electrically connected to an upper surface of said second back electrode across said third groove and an upper surface of said first insulating member,
wherein said conductive member is provided separately from said second back electrode.

2. The photovoltaic apparatus according to claim 1, further comprising a fourth groove formed on said region located between said second groove and said third groove to pass through said second back electrode, said second photoelectric conversion portion, said intermediate layer and said first photoelectric conversion portion and expose the surface of said first substrate electrode,
wherein said conductive member is embedded in said fourth groove to come into contact with the surface of said first substrate electrode exposed in said fourth groove and formed to be electrically connected to said second back electrode across said first insulating member embedded in said third groove.

3. The photovoltaic apparatus according to claim 1, wherein said conductive member includes a conductive melt portion obtained by partially melting said second back electrode, said second photoelectric conversion portion, said intermediate layer and said first photoelectric conversion portion and electrically connected to said first substrate electrode and a connecting portion formed to be electrically connected to said melt portion and to be electrically connected to said second back electrode across said first insulating member embedded in said third groove on said region located between said second groove and said third groove.

4. The photovoltaic apparatus according to claim 1, wherein said first insulating member fills up said third groove.

5. The photovoltaic apparatus according to claim 4, wherein the upper surface of said first insulating member is so formed as to project upward beyond the upper surface of said second back electrode.

6. The photovoltaic apparatus according to claim 1, wherein said conductive member is so formed as to come into contact with the surface of a region of said second back electrode located between said first groove and said third groove.

7. The photovoltaic apparatus according to claim 1, wherein said second groove is so formed as to pass through said second back electrode, said second photoelectric conversion portion, said intermediate layer and said first photoelectric conversion portion and expose the surface of said first substrate electrode.

8. The photovoltaic apparatus according to claim 1, wherein said third groove is so formed as to pass through said second back electrode, said second photoelectric conversion portion, said intermediate layer and said first photoelectric conversion portion and expose the surface of said first substrate electrode.

9. The photovoltaic apparatus according to claim 1, further comprising a second insulating member embedded in said second groove.

10. The photovoltaic apparatus according to claim 9, wherein said second insulating member fills up said second groove.

11. The photovoltaic apparatus according to claim 1, wherein said intermediate layer has a function of partly reflecting and partly transmitting light incident from the side of said substrate.

* * * * *